(12) United States Patent
Schuster et al.

(10) Patent No.: US 6,445,510 B1
(45) Date of Patent: Sep. 3, 2002

(54) OPTICAL IMAGING DEVICE, IN PARTICULAR LENS SYSTEM, WITH AT LEAST ONE SYSTEM DIAPHRAGM

(75) Inventors: Karlheinz Schuster, Koenigsbronn; Thomas Bischoff, Aalen; Bernhard Gellrich, Aalen; Michael Muehlbeyer, Aalen; Guenter Maul, Aalen, all of (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 0 day.

(21) Appl. No.: 09/678,715

(22) Filed: Oct. 4, 2000

(30) Foreign Application Priority Data

Nov. 20, 1999

(DE) .......................................... 199 55 984

(51) Int. Cl.⁷ ................................................ G02B 9/00
(52) U.S. Cl. ........................................ 359/739; 359/738
(58) Field of Search ................................ 359/819, 738, 359/739, 740, 741

(56) References Cited

U.S. PATENT DOCUMENTS

| | | | |
|---|---|---|---|
| 3,997,906 A | 12/1976 | Kashiwase | 396/65 |
| 4,149,775 A | 4/1979 | Blake | 396/696 |
| 5,742,436 A | 4/1998 | Fürter | 359/727 |
| 6,154,613 A | * 11/2000 | Kawai | 396/64 |
| 6,161,966 A | * 12/2000 | Chang et al. | 396/508 |
| 6,239,923 B1 | * 5/2001 | Takezawa | 359/739 |

FOREIGN PATENT DOCUMENTS

| | | | |
|---|---|---|---|
| EP | 362 700 A | 4/1990 | G02B/5/00 |
| JP | A 11-195607 | 7/1999 | |

* cited by examiner

Primary Examiner—Georgia Epps
Assistant Examiner—Saeed Seyrafi
(74) Attorney, Agent, or Firm—Welsh & Katz, Ltd.

(57) ABSTRACT

An optical imaging device, in particular a lens system, has a system diaphragm (1). An aperture of the system diaphragm (1) is adjustable in its opening diameter (D). The axial position of the aperture of the system diaphragm (1) with respect to the optical axis (4) of the system diaphragm (1) is fixed in dependence on the opening diameter (D) of the system diaphragm (1).

12 Claims, 2 Drawing Sheets

OPTICAL IMAGING DEVICE, IN PARTICULAR LENS SYSTEM, WITH AT LEAST ONE SYSTEM DIAPHRAGM

BACKGROUND OF THE INVENTION

The invention relates to an optical imaging device, in particular a lens system, with at least one system diaphragm, an aperture of the system diaphragm being adjustable in its opening diameter.

The use of diaphragms of various types as system diaphragms in optical imaging devices is generally known. These diaphragms, which can be changed in their opening diameter, allow the diameter of the bundle of rays passing through the optical imaging device to be continuously varied. As a result, depending on the application, the optical imaging quality can be influenced with regard to, for example, the resolution, contrast or depth of field.

Especially popular are so-called iris diaphragms, which have at least four—but usually more—thin leaves, which are generally sickle-shaped and are rotatably mounted at one end in a fixed mount. The other end is in this case provided with a pin as a guiding device, which is inserted in a groove or slotted guideway of a rotatable ring such that, by turning the rotatable ring, the leaves can be moved in such a way that the remaining opening diameter of the diaphragm can be varied.

In the case of high-performance lens systems, in particular for use in the exposure of lithographically produced semiconductor devices, increasingly complex techniques are being used for optimizing the quality of the imaging device. Optimizing the elements which exclusively act optically, such as surface coatings of the lenses for example, has in this respect largely been taken to the technical limits, so that further increases in imaging quality can be realized only with very great expenditure.

It is therefore the object of the invention to improve the optical properties of the imaging device, such as the telecentering error or other image errors for example, by optimizing the optical-mechanical devices, in particular the system diaphragms in an imaging device.

This object is achieved according to the invention by the position of the aperture of the system diaphragm being fixed in dependence on the opening diameter of the system diaphragm.

Very complex mathematical or optical calculations from the field of optics have shown in a surprising way that changing the position of the system diaphragm in dependence on its opening diameter makes it possible to obtain an improvement in quality with respect to the imaging quality of the optical imaging device. In this respect, changing the axial position of the system diaphragm is undoubtedly the preferred movement of the latter, but a sideward or tilting movement or any desired combination of the three movements mentioned above are also conceivable.

SUMMARY OF THE INVENTION

Given that the ways of optimizing the lens systems have largely been exhausted, the benefits and advantageous improvements which can be achieved by the system diaphragm according to the invention bring about a comparatively simple and favorable possible way of enhancing imaging quality.

In particular in the area of the production of semiconductor devices or computer chips, especially high requirements have to be imposed on the imaging quality and resolution of the imaging devices. This is because the imaging devices are used for imaging extremely small patterns, just still able to be produced mechanically, for a chip layout in a reduced form on a silicon wafer coated with a light-sensitive layer. Using various etching methods, which the silicon wafer passes through, the circuits of the computer chip or semiconductor device are then formed from the microstructures exposed in this way. Extremely small deviations and distortions caused by the imaging device in the imaging of the pattern for the chip layout on the silicon wafer are themselves sufficient to lead to line contacts, short-circuits or other electronic malfunctions in the microstructures of the finished computer chip. Therefore, specifically in the case of the imaging devices used in the production of computer chips and semiconductor devices, even extremely small improvements in quality bring great advantages, for which reason the optical benefits of the system diaphragm which is adjustable in its axial position are shown to their full advantage here.

In a particularly favorable embodiment of the invention, changing the axial position of the system diaphragm in dependence on its opening diameter is achieved in a construction of a comparatively simple design. The system diaphragm has in this case at least two diaphragms arranged at an axial distance from one another, what is respectively another diaphragm being optically active in dependence on the opening diameter of the system diaphragm. Optically active means in this case that the optically active diaphragm or its optically effective edge provides the lateral limitation of the bundle of rays in the imaging device.

This double or multiple diaphragm according to the invention has the advantage that the effect according to the invention can be achieved here without complex mechanisms for adjusting the axial position. In this case, the at least two diaphragms are arranged such that they lie in at least two different planes which are axial with respect to the optical axis of the system diaphragm. As a result of the fact that in each case only one of the diaphragms is optically active, a different plane and consequently a different axial position of the system diaphragm can be realized according to the opening diameter, whereby a good optical effect is already achieved. Critical in this case is the area when two of the diaphragms "override", that is when, at a certain opening diameter of the system diaphragm, the optically effective edges of two of the diaphragms are briefly optically active at the same time. To avoid blurring effects, this requires a very precise mechanism, such as for example the mounting of the diaphragms or their individual parts by means of rolling bearing elements prestressed without any backlash.

In a further very favorable embodiment of the invention, the system diaphragm has leaves which are arranged between two diaphragm bases which are rotationally movable relatively with respect to one another, at least one of the diaphragm bases being rotationally movable and the unit comprising the leaves and the two diaphragm bases being movable in the axial direction.

This variant of a solution for achieving the object in a way according to the invention manages with only a single diaphragm. In addition to the at least two discrete axial planes of the embodiment described above, this offers the advantage that all the axial intermediate planes are available. This is because, depending on the opening diameter of the diaphragm, the latter can change its axial position, since the unit comprising leaves and diaphragm bases which are movable relatively with respect to one another is coupled by mechanical guiding elements in such a way that the desired adjustment of the axial position of the diaphragm can be brought about in dependence on the opening diameter.

This structural design has the particular advantage that a guiding groove which coordinates the rotational and axial movements of the two diaphragm bases with respect to one another can be made in any desired geometrical form. Depending on the form of the guiding groove, different mathematical dependences between the rotational movement, and consequently the changing of the opening diameter, and the axial movement of the system diaphragm can in this case be realized.

In a further very favorable variant of the invention, the diaphragm is likewise formed by means of leaves, the leaves and the surfaces of the diaphragm bases facing the leaves being arranged over the at least approximately greatest part of the opening diameter of the system diaphragm at an angle with respect to the optical axis of the system diaphragm.

As a result, the optically effective edge of the diaphragm can, depending on the geometrical shape of the leaves and of the surfaces of the diaphragm bases facing the leaves, be moved on, for example, a lateral surface of a cone or on the lateral surface of a spherical cap. The leaves, arranged in a rotationally symmetrical manner with respect to the optical axis of the system diaphragm, then move into the light path of the imaging device, for example when the system diaphragm is closed, in a linear or semicircular dependence between the opening diameter and the axial position.

CONCISE DESCRIPTION OF THE DRAWINGS

Further advantageous refinements of the invention emerge from the remaining subclaims and from the exemplary embodiments described below with reference to the drawings, in which:

DETAILED DESCRIPTION OF THE DRAWINGS

Figure 1:
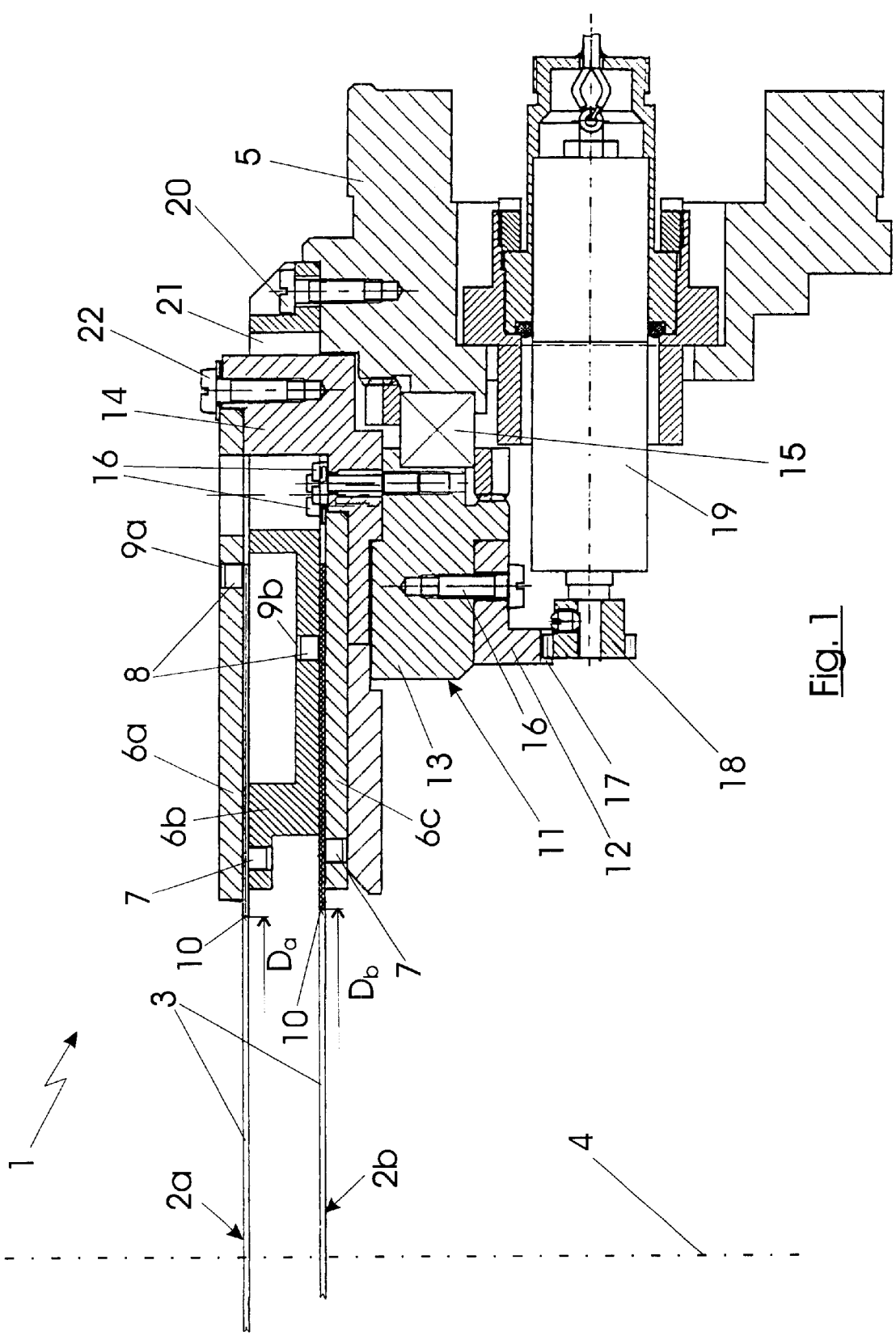
FIG. 1 shows a cross section of a system diaphragm of an optical imaging device with a plurality of diaphragms lying one above the other.

Represented in FIG. 1 is a cross section through a system diaphragm 1, the system diaphragm 1 having two individual diaphragms 2a, 2b or iris diaphragms 2a, 2b. These iris diaphragms 2a, 2b are made up of leaves 3, which are arranged at least approximately perpendicular with respect to the optical axis 4 of the system diaphragm 1. The system diaphragm 1 is mounted in a mount 5, the mount 5 being fixedly connected to a casing of a lens system (not represented).

In an embodiment (not represented) of the system diaphragm 1, the latter may have in addition to the two individual diaphragms 2a, 2b also a further diaphragm. In particular, this further diaphragm may be a fixed diaphragm or a permanently installed disk which is fitted at an axial distance from the two iris diaphragms 2a, 2b in the system diaphragm 1.

The leaves 3 of the two diaphragms 2a, 2b lie with their sides facing away from the respective opening diameter $D_a$, $D_b$ between two diaphragm bases 6a, 6b, 6c which are respectively movable relatively with respect to one another. In this case, the leaves 3 are mounted in respectively one of the diaphragm bases 6b, 6c interacting with them by bearing devices 7 prestressed without backlash. In the region of what is respectively the other diaphragm base 6a, 6b, each of the leaves 3 has a guiding device 8. The guiding devices 8 are guided in a slotted guideway 9a, 9b made in the respective diaphragm bases 6a, 6b, a prestressing of the guiding devices 8 without backlash with respect to the slotted guideway 9a, 9b also having to be provided here.

The prestressing without backlash of the bearing or guiding devices 7 and 8 may be designed for example such that each of the leaves 3 is prestressed by torsion springs (not represented) in such a way that it is accommodated without backlash in the bearing device 7, for example a rolling bearing, and the respective slotted guideway 9a, 9b.

By a rotational relative movement of the diaphragm bases 6a, 6b or 6b, 6c with respect to one another, the leaves 3 mounted by the bearing devices 7 are moved by the guiding devices 8, running in the variously formed slotted guideways 9a, 9b, on a path prescribed for the respective leaf. As a result, optically effective edges 10a, 10b, of the leaves 3 change their opening diameter $D_a$, $D_b$. Usually, the slotted guideways 9a, 9b of the iris diaphragms 2a, 2b are made in such a way that the aperture of the system diaphragm 1 or of each of the iris diaphragms 2a, 2b can be increased or reduced in size in the manner of an approximately circular polygon.

The shaping of the slotted guideways 9a, 9b of the system diaphragm 1 present here must in this case have in each case a different geometrical curve, since it is required that, depending on the opening diameter, on one occasion the one iris diaphragm 2a, on another occasion the other iris diaphragm 2b, or their respective optically effective edge 10, is optically active. This means that the optically inactive iris diaphragm 2a or 2b must have a greater opening diameter $D_a$ or $D_b$ than the respectively optically active iris diaphragm 2b or 2a.

In the case in which the system diaphragm 1 has a third fixed diaphragm (not represented), there may additionally occur the case in which none of the two iris diaphragms 2a or 2b is optically active, but only the fixed diaphragm arranged at an axial distance from the iris diaphragms 2a, 2b.

In the exemplary embodiment represented in FIG. 1, two of the diaphragm bases 6a, 6c are connected fixedly, in particular fixedly in terms of torsion, to a ring gear 11. The ring gear 11, made up of a plurality of individual elements 12, 13, 14, is mounted by a rolling bearing 15 in the mount 5 and the individual elements 12, 13, 14 of the ring gear 11 are interconnected by a plurality of fastening elements 16. In addition, one of the individual elements 12 of the ring gear 11 has a toothing 17 and can be set in a rotational movement with respect to the optical axis 4 of the system diaphragm 1 by a pinion 18. In the exemplary embodiment represented, a drive unit 19, here an electric motor 19, serves the purpose of turning the pinion 18, and consequently the ring gear 11 and the diaphragm bases 6a, 6c connected to it, about the optical axis 4 of the system diaphragm 1. The drive unit 19 is in this case fixedly connected to the mount 5. The diaphragm base 6b situated between the two iris diaphragms 2a, 2b is likewise fixed to the mount 5 by means of a fastening element 20. In this case, one of the individual elements 14 of the ring gear 11 is led through one or more clearances 21 in the diaphragm base 6b lying between the two iris diaphragms 2a, 2b. The diaphragm base 6a is fastened by a further fastening element 22 to the individual element 14 of the ring gear 11.

If the ring gear 11 and the two diaphragm bases 6a, 6c are then turned by the drive unit 19, the diaphragm base 6b connected via fastening element 20 to the mount 5 remains fixed in place and a relative movement takes place between the diaphragm bases 6a, 6c and the diaphragm base 6b. This relative movement has the effect that the leaves 3 guided in the slotted guideways 9a, 9b are moved and the opening diameter $D_a$ or $D_b$ of the system diaphragm 1 or of the two iris diaphragms 2a, 2b changes.

The geometrical shaping of the slotted guideways 9a, 9b, then allow the effect to be achieved that the iris diaphragm 2a, 2b better suited for the respective opening diameter $D_a$, $D_b$ of the system diaphragm 1 is optically active. Consequently, from the two discrete axial positions of the iris diaphragms 2a, 2b, the one which is optically better suited in each case is selected, only a single turning movement having to be performed and actuated for this purpose. It should be clear here that this necessitates a constant, or at least approximately constant, dependence of the axial position of the diaphragm 2a, 2b on its opening diameter $D_a$, $D_b$, since the slotted guideways 9a, 9b serving as mechanical guides can be shaped only such that firstly one, then the other iris diaphragm 2a, 2b is optically active.

Figure 2:
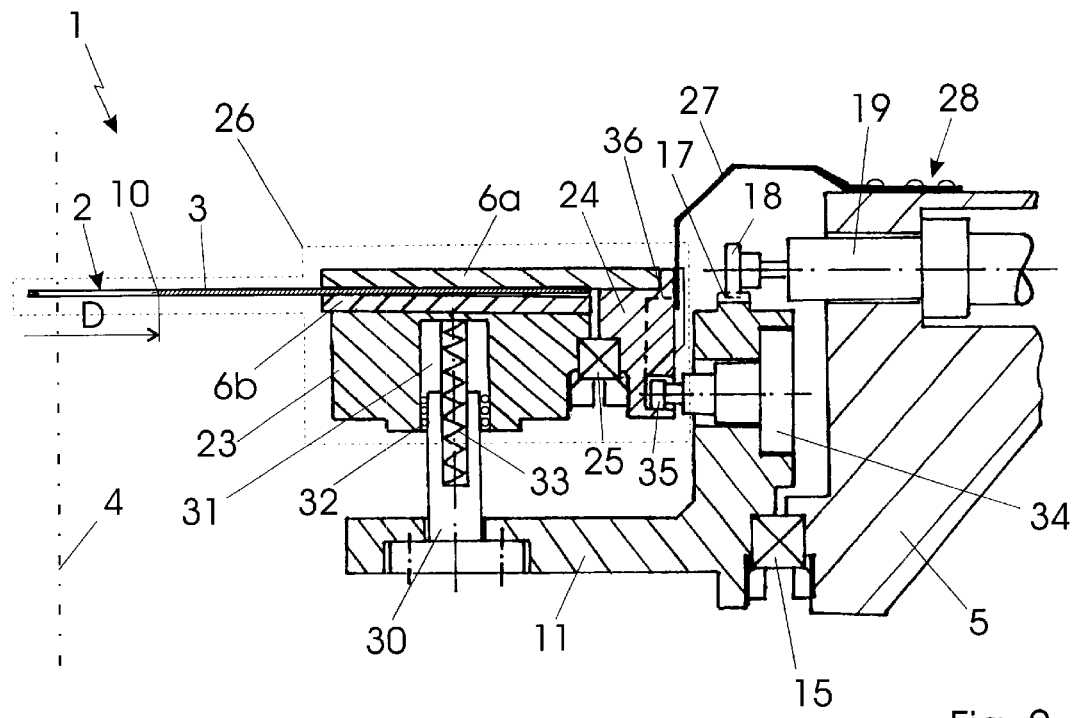
FIG. 2 shows a cross section of a system diaphragm with a structural unit comprising leaves and diaphragm bases which is movable in the axial direction.

A further refinement of the system diaphragm can be seen in FIG. 2. This has just one iris diaphragm 2. Here, too, the leaves 3 of the iris diaphragm 2 are arranged between two diaphragm bases 6a, 6b or grooved ring 6a and diaphragm base 6b. The bearing devices 7 and the guiding devices 8 or the slotted guideway 9 (not represented in FIG. 2) likewise exist here, but only one per leaf 3. The further elements in FIG. 2 are in principle comparable in construction and mode of operation to those explained in FIG. 1.

Consequently, the mount 5 in which the drive unit 19 with the pinion 18 is accommodated can also be seen in FIG. 2. The pinion 18 drives a ring gear 11, formed here as one part, via the toothing 17. The ring gear 11 is mounted by the rolling bearing 15 in the mount 5.

Together with the grooved ring 6a and the diaphragm base 6b, an inner ring 23, an outer ring 24 and a rolling bearing 25, the iris diaphragm 2 forms a structural unit 26. In the structural unit 26, the diaphragm base 6b is connected to the inner ring 23, the grooved ring 6a is connected to the outer ring 24. The inner ring 23 is made such that it is rotationally movable with respect to the outer ring 24, the rolling bearing 25 being arranged between the inner ring 23 and the outer ring 24. A relative movement of the two diaphragm bases 6a, 6b with respect to one another consequently also means that there is a relative movement of the inner ring 23 with respect to the outer ring 24.

The outer ring 24, and consequently also the one diaphragm base 6a, is held securely in terms of torsion with respect to the mount 5 by means of holding elements 27. The holding elements 27 may be designed for example as sheet-metal butt straps 27, which are attached to the mount 5 by means of fastening elements 28. On the outer ring 24, the sheet-metal butt straps then come to lie between two projections, which allow an axial movement of the outer ring 24, but prevent torsion. Ideally, in this case three to six holding elements 27 are distributed over the circumference of the system diaphragm 1.

The ring gear 11 has one or more driving lugs 30, these being distributed if appropriate uniformly over the circumference of the system diaphragm 1. The driving lugs 30 in this case respectively engage in a clearance 31 in the inner ring 23, so that a rotational movement of the ring gear 11 produced by the driving device 19 is transferred to the inner ring 23 and consequently to the diaphragm base 6b. The driving lugs 30 are mounted in the respective clearances 31 by rolling elements 32 in such a way that a low-friction and largely backlash-free axial relative movement of the inner ring 23 with respect to the driving lug 30 and consequently also with respect to the ring gear 11 is possible.

In addition, the connection of the driving lug 30 and of the inner ring 23 has a spring element 33, which is made in such a way that it holds the structural unit 26 in an axial center position, so that the axial movement of the structural unit 26 with respect to the ring gear 11 is possible in both directions with comparatively low forces.

Furthermore, the ring gear 11 has a guiding lug 34 fixedly connected to it. The tip of the guiding lug 34 is provided with a rolling bearing 35, which runs in a guiding groove 36 in the outer ring 24. The guiding groove 36 and the rolling bearing 35 of the guiding lug 34 in this case form the mechanical coupling of the rotational movement of the ring gear 11 with the axial movement of the structural unit 26.

If the ring gear 11 is then turned by the pinion 18 or the drive unit 19, the outer ring 24, held fixedly in terms of torsion by the holding elements 27, is immovable in the radial direction of rotation with respect to the inner ring 23 turned at the same time by the driving lugs 30 of the ring gear 11. However, an axial relative movement of the structural unit 26 with respect to the ring gear 11 is enforced by the guiding groove 36 corresponding with the rolling bearing 35 or the guiding lug 34. With the ring gear 11 fixed axially with respect to the mount 5, this means that the outer ring 24 is displaced axially with respect to the mount 5. This axial movement is also transferred by the rolling bearing 25 to the inner ring 23; the complete structural unit 26 is displaced in the axial direction. At the same time, the driving lugs 30 cause the rotational movement of the inner ring 23 and of the diaphragm base 6b, whereby the iris diaphragm 2 opens or closes. The rotational movement of the ring gear 11 consequently has the effect at the same time that the opening diameter D of the system diaphragm 1 and the axial position of the structural unit 26 or of the iris diaphragm 2 change in dependence on one another.

Depending on the shape and form of the guiding groove 36, the optically effective edge 10 of the iris diaphragm 2 can move on almost any desired curve. In the exemplary embodiment represented in FIG. 2, the dependence between the opening diameter D and the axial position of the optically effective edge 10 of the system diaphragm 1 is consequently selectable within the scope of the production possibilities for the guiding groove 36 or according to the given optical requirements, only constant curves generally being appropriate both from optical aspects and from technical production aspects.

Figure 3:
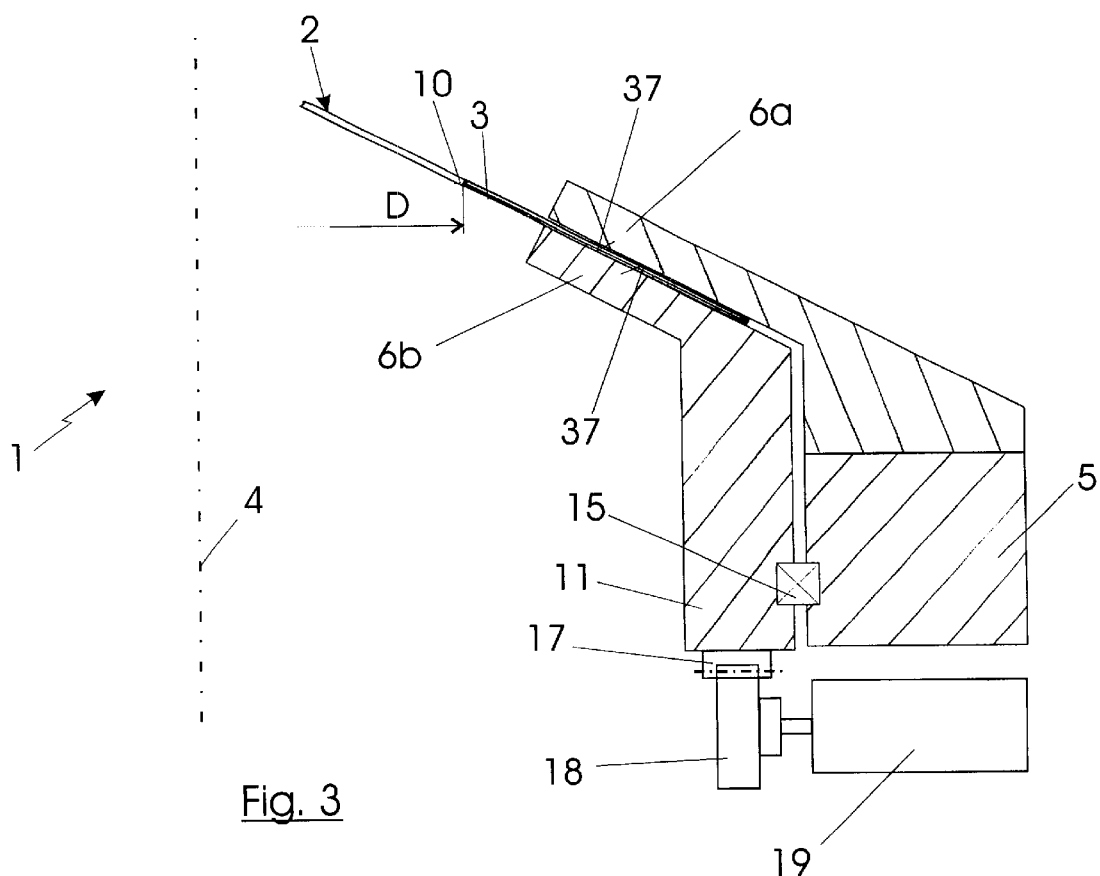
FIG. 3 shows a cross section of a system diaphragm with an arrangement of the leaves at an angle with respect to the optical axis of the system diaphragm.

FIG. 3 shows a basic diagram of a further embodiment of the system diaphragm 1. Here, the elements already described in the preceding figures can likewise be seen. The one diaphragm base 6a is fixedly connected to the outer mount 5. The other diaphragm base 6b is mounted in the mount 5 by means of the rolling bearing 15. Part of the diaphragm base 6b at the same time represents the ring gear 11 and can be moved rotationally by means of the drive unit 19 with the pinion 18. The leaves 3 of the iris diaphragm 2 are moved by means of the bearing devices 7, guiding devices 8 and slotted guideways 9 (not represented here) already described in the preceding figures.

The special feature of this embodiment is that the leaves 3 of the diaphragm 2 are arranged in such a way that each individual one is arranged at an acute angle with respect to the optical axis of the system diaphragm 1. The optically effective edges 10 of the leaves 3 or the iris diaphragm 2 then move on the lateral surface for example of a cone or paraboloid of revolution. Depending on the situation prescribed by the lateral surface, the axial position of the optically effective edge 10 of the iris diaphragm 2 can be prescribed here in dependence on its opening diameter D.

In this case, both the leaves 3 and the surfaces 37 of the diaphragm bases 6a, 6b facing the leaves 3 are designed in the form of the desired lateral surface. The lateral surface should in this case always be the lateral surface of a body rotationally symmetrical with respect to the optical axis 4 of the system diaphragm 1. The optically effective edges 10 of the leaves 3 then move on this respective surface.

What is claimed is:

1. An optical imaging device, in particular a lens system, with at least one system diaphragm, an aperture of the system diaphragm being adjustable in its opening diameter size, wherein the axial position of the aperture of the system diaphragm maintains a positional relationship with the opening diameter size of the system diaphragm.

2. The optical imaging device as claimed in claim 1, wherein the system diaphragm has leaves designed such that they are movable in relation to one another, at least parts of the leaves being arranged between two diaphragm bases which are movable relatively with respect to one another, and the diaphragm bases having guiding devices by which individual leaf can be guided on a prescribed path.

3. The optical imaging device as claimed in claim 2, wherein the diaphragm bases are movable relatively with respect to one another by a driving device, each leaf being mounted in respectively one of the diaphragm bases by a guiding device prestressed without backlash and being guided in what is respectively the other diaphragm base by a bearing device prestressed without backlash.

4. The optical imaging device as claimed in claim 2, wherein the leaves of the system diaphragm are arranged at least approximately perpendicular with respect to the optical axis.

5. The optical imaging device as claimed in claim 1, wherein the system diaphragm has at least two diaphragms arranged at an axial distance from one another, what is respectively another diaphragm being optically active in dependence on the opening diameter of the system diaphragm.

6. The optical imaging device as claimed in claim 5, wherein the diaphragms respectively have the leaves, parts of the leaves being arranged between the in each case two diaphragms bases which are movable relatively with respect to one another, and one of the diaphragm bases having the bearing devices of the leaves of the one diaphragm and the bearing device or the guiding devices of the leaves of the other diaphragm.

7. The optical imaging device as claimed in claim 1, wherein the leaves of the system diaphragm are arranged between two diaphragm bases which are movable relatively with respect to one another, at least one of the diaphragm bases being rotationally movable, and the structural unit comprising the leaves and the two diaphragm bases being movable in the axial direction.

8. The optical imaging device as claimed in claim 7, wherein the rotational movement of the at least one diaphragm base is coupled by mechanical elements with the axial movement of the structural unit comprising the leaves and the two diaphragm bases.

9. The optical imaging device as claimed in claim 7, wherein, to prevent a rotational movement of one of the diaphragm bases, one or more holding elements connected by means of driving lugs to a rotationally movable ring gear being coupled to one another by a guiding groove and a guiding lug.

10. The optical imaging device as claimed in claim 9, wherein the driving lugs and the ring gear are fixed in place in the axial direction, the driving lug having in the axial direction a spring element which is connected to one of the diaphragm bases.

11. The optical imaging device as claimed in claim 1, wherein the leaves and the surfaces of the diaphragm bases facing the leaves are arranged over the at least approximately greatest part of the opening diameter of the system diaphragm at an acute angle with respect to the optical axis of the system diaphragm.

12. The optical imaging device as claimed in claim 9, wherein the leaves and the surfaces of the diaphragm bases facing the leaves are arranged in a form which is designated such that it is rotationally symmetrical with respect to the optically effective edges of the leaves being able to be moved by the relative movement of the diaphragm bases in relation to one another on a lateral surface of a geometrical body designed such that it is rotationally symmetrical with respect to the optical axis of the system diaphragm.

* * * * *

UNITED STATES PATENT AND TRADEMARK OFFICE
CERTIFICATE OF CORRECTION

PATENT NO. : 6,445,510 B1
DATED : September 3, 2002
INVENTOR(S) : Schuster et al.

It is certified that error appears in the above-identified patent and that said Letters Patent is hereby corrected as shown below:

Title page,
Item [73], Assignee: "Carl-Zeiss-Stiftung" should be -- Carl-Zeiss-Stiftung trading as Carl Zeiss --;

Column 5,
Line 56, insert -- 29 -- after the word "projections";

Column 8,
Line 2, "diaphragms" should be -- diaphragm --.

Signed and Sealed this

Seventh Day of January, 2003

JAMES E. ROGAN
*Director of the United States Patent and Trademark Office*